United States Patent
Dubois

(10) Patent No.: US 10,281,879 B2
(45) Date of Patent: May 7, 2019

(54) MICROMECHANICAL TIMEPIECE PART COMPRISING A LUBRICATED SURFACE AND METHOD FOR PRODUCING SUCH A MICROMECHANICAL TIMEPIECE PART

(71) Applicant: Nivarox-FAR S.A., Le Locle (CH)

(72) Inventor: Philippe Dubois, Marin (CH)

(73) Assignee: Nivarox-FAR S.A., Le Locle (CH)

( * ) Notice: Subject to any disclaimer, the term of this patent is extended or adjusted under 35 U.S.C. 154(b) by 122 days.

(21) Appl. No.: 15/231,876

(22) Filed: Aug. 9, 2016

(65) Prior Publication Data
US 2017/0068218 A1 Mar. 9, 2017

(30) Foreign Application Priority Data
Sep. 8, 2015 (EP) .................................. 15184188

(51) Int. Cl.
*B81C 1/00* (2006.01)
*G04B 15/14* (2006.01)
*G04B 31/08* (2006.01)

(52) U.S. Cl.
CPC .......... *G04B 31/08* (2013.01); *B81C 1/00674* (2013.01); *G04B 15/14* (2013.01); *B81B 2201/035* (2013.01)

(58) Field of Classification Search
CPC ...... G04B 13/00; G04B 13/02; G04B 13/022; G04B 13/026; G04B 15/14; G04B 31/00; G04B 31/08
See application file for complete search history.

(56) References Cited

U.S. PATENT DOCUMENTS

| 4,725,511 | A | * | 2/1988 | Reber | .................. A44C 27/00 29/896.32 |
| 5,395,807 | A | * | 3/1995 | Divakar | ................ C04B 35/565 264/44 |
| 5,441,799 | A | * | 8/1995 | Owens | ..................... C04B 38/00 277/404 |

(Continued)

FOREIGN PATENT DOCUMENTS

DE 10 2009 046 647 A1 5/2011
EP 1 705 533 A1 9/2006

OTHER PUBLICATIONS

European Search Report dated Mar. 4, 2016 in European Application 15184188, filed on Sep. 8, 2015 ( with English Translation of Categories of Cited Documentws).

(Continued)

*Primary Examiner* — Amy Cohen Johnson
*Assistant Examiner* — Daniel P Wicklund
(74) *Attorney, Agent, or Firm* — Oblon, McClelland, Maier & Neustadt, L.L.P.

(57) ABSTRACT

A micromechanical timepiece part includes a silicon-based substrate having at least one surface, at least one part of the surface having pores which open out at the external surface of the micromechanical timepiece part and the pores include a tribological agent. A method for producing a micromechanical timepiece part starting from a silicon-based substrate, the silicon-based substrate having at least one surface, at least one part of which is lubricated by a tribological agent, the method includes the steps of forming pores on the surface of the part of the surface of the silicon-based substrate, and depositing the tribological agent in the pores.

12 Claims, 1 Drawing Sheet

(56) References Cited

U.S. PATENT DOCUMENTS

| | | | | |
|---|---|---|---|---|
| 7,926,355 B2* | 4/2011 | Bannier | | G04B 35/00 73/760 |
| 8,944,676 B2* | 2/2015 | Conus | | G04B 13/022 267/182 |
| 2006/0055097 A1* | 3/2006 | Conus | | G04B 17/066 267/273 |
| 2008/0112274 A1* | 5/2008 | Bitterli | | G04B 13/026 368/238 |
| 2011/0045249 A1* | 2/2011 | Sato | | G04B 15/14 428/157 |
| 2012/0090933 A1* | 4/2012 | Conus | | G04B 13/022 188/371 |
| 2013/0286795 A1* | 10/2013 | Conus | | G04B 13/022 368/127 |
| 2014/0066343 A1* | 3/2014 | Bielecki | | C09D 133/08 508/103 |
| 2014/0147627 A1* | 5/2014 | Aizenberg | | A61L 15/24 428/141 |
| 2014/0328999 A1* | 11/2014 | Aizenberg | | A61L 27/56 427/2.26 |
| 2015/0050556 A1* | 2/2015 | Liu | | C09K 13/08 429/218.1 |
| 2015/0196940 A1* | 7/2015 | Aizenberg | | B05D 5/08 428/141 |
| 2015/0209846 A1* | 7/2015 | Aizanberg | | A61L 29/06 428/142 |
| 2016/0032448 A1* | 2/2016 | Kim | | C23C 16/045 428/221 |

OTHER PUBLICATIONS

H. Foll et al. "Formation and Application of Porous Silicon", Materials Science and Engineering R:, Reports, vol. 39, No. 4, 2002, 49 pages.

Walter Lang "Silicon Microstructuring Technology", Materials Science and Engineering R: Reports, vol. 17, No. 1, 1996, 55 pages.

\* cited by examiner

MICROMECHANICAL TIMEPIECE PART COMPRISING A LUBRICATED SURFACE AND METHOD FOR PRODUCING SUCH A MICROMECHANICAL TIMEPIECE PART

This application claims priority from European Patent application 15184188.9 of Sep. 8, 2015, the entire disclosure of which is hereby incorporated herein by reference.

FIELD OF THE INVENTION

The present invention relates to a micromechanical timepiece part comprising a silicon-based substrate, lubricated by means of a tribological agent. The invention likewise relates to a method for producing such a micromechanical timepiece part.

BACKGROUND OF THE INVENTION

Silicon is a material which is used more and more in the manufacture of micromechanical timepiece parts, in particular parts which remain connected to a silicon-based substrate on which they have been machined.

With respect to the metals or alloys which are used as standard for manufacturing micromechanical timepiece parts, such as toothed wheels, or components of the escapement, silicon has numerous advantages. It is a very hard material of very light weight which makes it therefore possible for it to have very reduced inertia and consequently to improve the efficiency. Silicon likewise makes it possible to produce complex or monobloc parts.

Nevertheless, just as the other materials which are used more as standard in clockmaking, the timepiece parts produced from a silicon-based substrate must be lubricated.

It is known to use for example a very fluid lubricant which promotes a low coefficient of friction in the case of low contact pressures. However, this type of lubricant has the disadvantage of having its effect diminished, in particular during higher contact pressures, because of rupture of the lubricant film. It is known that supra-lubrication techniques, based on the formation of polymer brushes deposited on the surface and their impregnation with a lubricant having an affinity with the polymer brushes, make it possible to reduce the friction greatly for a wide range of stresses. These very flexible polymer brushes straighten out again when they are impregnated with the lubricant, thus forming a sort of sponge full of lubricant. According to the friction conditions, during large contact pressures, the fibres can be compressed easily and restore lubricant into the contact. The result of this is the formation of a thicker lubricant film which results in a substantial drop in the coefficient of friction and in wear and tear. However, during stresses of long duration, these polymer brushes finish up being degraded (wear and tear, scratching of the surface), which no longer makes it possible for the polymer brush coating to ensure its function.

It is therefore necessary to propose a new method for lubricating a micromechanical timepiece part based on silicon which makes it possible to contain, on the surface of the timepiece part to be lubricated, sufficient quantities of lubricant in order to reduce the frequency of maintenance services of the timepiece movement comprising said timepiece part.

It is likewise necessary to propose a new method for lubricating a silicon-based micromechanical timepiece part which makes it possible to create lubrication conditions allowing a significant reduction in wear and tear and in the coefficient of friction so as to increase reliability, efficiency and consequently the power reserve of the clock movement comprising this timepiece part, and in fact for a wide range of stresses.

SUMMARY OF THE INVENTION

To this end, the present invention relates to a micromechanical timepiece part comprising a silicon-based substrate, having at least one surface.

According to the invention, at least one part of said surface of the silicon-based substrate has pores which open out at the external surface of the micromechanical timepiece part, said pores comprising a tribological agent.

The present invention likewise relates to a method for producing a micromechanical timepiece part starting from a silicon-based substrate, said silicon-based substrate having a surface, at least one part of which is lubricated by a tribological agent, said method comprising, in order, the steps of:

a) forming pores on the surface of the part of said surface of said silicon-based substrate, b) depositing said tribological agent in said pores.

The formation of pores starting from the surface of the silicon-based substrate makes it possible to form a porous, silicon-based superstructure which has a certain degree of flexibility and is able to accommodate various pressure conditions by deforming. Furthermore, this type of structure has cavities which make it possible to contain, in a durable manner, a large reserve of lubricant.

Furthermore, in the case where polymer brushes are deposited on the porous, silicon-based superstructure, the obtained coating is able to be filled with lubricant and to restore it when these polymer brushes are compressed. This coating likewise assists penetration of the lubricant into the cavities of the porous, silicon-based superstructure.

BRIEF DESCRIPTION OF THE DRAWINGS

The aims, advantages and features of the present invention will appear more clearly in the following detailed description of several embodiments of the invention, given solely by way of non-limiting example, and illustrated by the appended drawings in which.

DETAILED DESCRIPTION OF THE INVENTION

Figure 1:
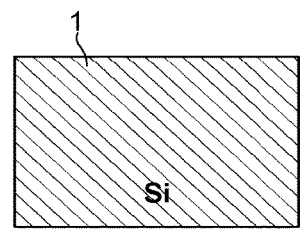
FIGS. 1 to 2 illustrate schematically the steps of a first embodiment of the manufacturing method according to the invention.
Figure 2:
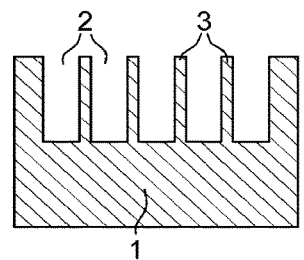

With reference to FIGS. 1 and 2, the method of producing a micromechanical timepiece part lubricated by a tribological agent starting from a silicon-based substrate 1 according to the invention comprises firstly a step a) of forming pores 2 starting from the surface of said silicon-based substrate 1 over a zone of the silicon-based substrate 1 which corresponds to a zone to be lubricated. The pores 2 are designed so as to open out at the external surface of the micromechanical timepiece part. The silicon-based substrate 1 is chosen as a function of the micromechanical timepiece part to be formed. The final shape of the silicon-based substrate 1, as a function of the micromechanical timepiece part to be manufactured, is given before or after implementation of the method of the invention. In the present invention, the expression <<silicon-based substrate>> describes both a layer of silicon in a substrate and a substrate made of silicon. Preferably, the silicon-based substrate 1 is a silicon wafer or an SOI wafer (Silicon-on-Insulator). The pores can be formed preferably over the surface perpendicular to the plane of the substrate, i.e. on the sides of the micromechanical timepiece part which are subject to friction, but likewise over the surface parallel to the plane of the substrate.

Advantageously, this step a) can be achieved by a method chosen from the group comprising a method by electrochemical etching, a method of the <<Stain-etch>> type, and a method of the <<MAC-Etch>> type.

The method by electrochemical etching can be a method by electrochemical anodisation. Its implementation requires the use of an electrochemical bath containing hydrofluoric acid in aqueous solution or mixed with ethanol in concentrations of 1 to 10%. An electrical current and electrodes are necessary to create electrochemical conditions which cause the etching of the silicon. According to the electrochemical conditions, various types of pores can be obtained. Such a method is known to the person skilled in the art and does not require detailed information here.

The method of the <<Stain-etch>> type is based on moist etching of the silicon resulting directly in the formation of porous silicon. Typically, the etching takes place with an $HF/HNO_3/H_2O$ solution with a ratio $HF:HNO_3$ of 50-500:1. This method has the advantage of not requiring any electrical supply in the bath. Such a method is known to the person skilled in the art and does not require detailed information here.

Preferably, step a) is achieved by a method of the <<MAC-Etch>> type. This method is based on the use of particles of noble metals in order to catalyse local chemical etching reactions. Typically, a very thin layer (10-50 nm) of a noble metal (gold, silver, platinum) is deposited and structured in a random manner or by lift-off, etching, laser, etc. For preference, the noble metal is gold. More particularly, there can advantageously be used particles of gold in solution in an $HF/H_2O_2$ mixture. The size of the particles can be between 5 and 1,000 nm. The structuring can be obtained by lithography of the gold, etching or lift-off. Another option is evaporation or cathodic pulverisation (sputtering) of a very fine, non-closed layer (5-30 nm). A thermal treatment will be able to contribute to the formation of islets of gold.

When the silicon with the layer of noble metal is immersed in an aqueous solution of an $HF/H_2O_2$ mixture, the noble metal locally catalyses the dissolution of the silicon. This etching solution can typically comprise between 4 ml:1 ml:8 ml (48% $HF$:30% $H_2O_2$:$H_2O$) and 4 ml:1 ml:40 ml (48% $HF$:30% $H_2O_2$:$H_2O$). The dissolution of the silicon is produced for preference under the metal, the latter penetrating then progressively into the silicon. This reaction can be continued over great depths (>100 μm) according to propagation modes essentially influenced by the orientation of the silicon crystal, the surface disposition, the doping and the chemistry of the bath. The method of the <<MAC-Etch>> type has the advantage of not requiring an electrical supply in the bath whilst allowing the formation of pores of very great depth (>100 μm) in the silicon. It is therefore particularly suitable for use for SOI wafers as substrate which are generally used for the manufacture of timepiece components.

The person skilled in the art knows the parameters of the methods described above to be implemented in order that the pores formed in the silicon-based substrate have a suitable geometry and size.

In particular, the pores can advantageously have an aspect factor (depth:diameter ratio) between 5 and 100.

Preferably, the pores can have a depth greater than 100 μm, preferably greater than 200 μm and more preferably greater than 300 μm.

As illustrated in FIG. 2, the formation of pores 2 in the silicon-based substrate 1 over a certain depth causes formation, between the pores 2, of silicon-based pillars 3 over the same depth. Preferably, when considering the silicon-based pillars as having a circular section, the pores 2 are formed so that the projected surface of the silicon-based pillars 3 is less than 79% of the apparent total surface in order not to have silicon-based pillars which are touching.

The second step b) of the method according to the invention consists of depositing in the pores 2, between the pillars 3, a tribological agent. The tribological agent is a lubricant and can be liquid, for example in the form of an aqueous solution, or dry. Preferably, said tribological agent is a perfluorocarbonated polymer, such as polytetrafluoroethylene (PTFE), or any other tribological agent or suitable lubricant.

According to a first embodiment of the method according to the invention, the tribological agent is deposited, according to step b), directly in the pores 2 of the silicon-based substrate. This step b) can be produced by a method of thin-film deposition, such as CVD, iCVD, PECVD. A suitable thermal treatment can be applied in order to polymerise the tribological agent, at temperatures of the order of 100° C. to 300° C. Thus, large quantities of tribological agent can be stored close to the surface of the silicon-based substrate, whilst preserving an apparent hardness of the surface which is relatively increased because of the silicon.

In a particularly advantageous manner, the parameters of the method of forming pores 2 in the silicon-based substrate 1, according to step a), are chosen in order that the pores 2 have a suitable geometry and size so that the pillars 3, formed between the pores 2, comprise silicon-based fibres 3'. These fibres 3' have an aspect factor (depth:diameter ratio) between 5 and 100. The fibres form a flexible superstructure and are finally impregnated with a tribological agent chosen in order to facilitate the wetting of the pores, according to step b) of the method according to the invention.

A substrate comprising silicon-based fibres can be used according to two other embodiments of the method of the invention.

Figure 3:
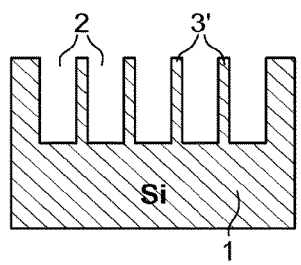
FIGS. 3 to 5 illustrate schematically the steps of a second embodiment of the manufacturing method according to the invention.
Figure 4:
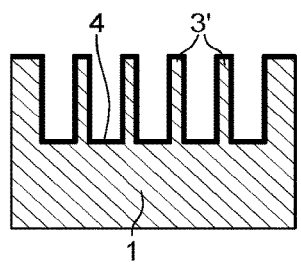
Figure 5:
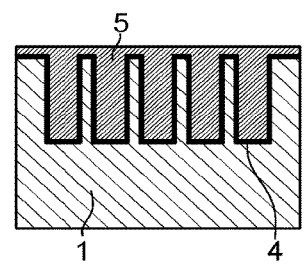

More particularly, with reference to FIGS. 3 to 5, according to a second embodiment of the method according to the invention, it is provided, according to step a), to produce, in a silicon-based substrate 1, pores 2 in order to form, between the pores 2, pillars 3 in the form of fibres 3', as shown in FIG. 3. There is therefore provided, between steps a) and b), a step c) of depositing at least one wetting agent 4 of the tribological agent on the walls of the silicon-based fibres 3'. The wetting agent 4 is chosen in order to facilitate wetting and penetration of the tribological agent. It is applied in order to form a very thin layer (a few nanometers) in order to functionalise the walls of the silicon-based fibres 3'. Then the fibres 3' are impregnated with a tribological agent 5, according to step b), the tribological agent 5 being chosen in order to facilitate the wetting of the pores 2.

Figure 6:
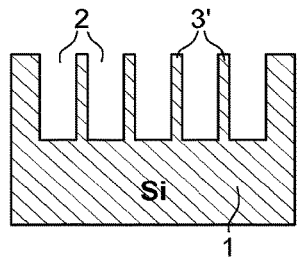
FIGS. 6 to 8 illustrate schematically the steps of a third embodiment of the manufacturing method according to the invention.
Figure 7:
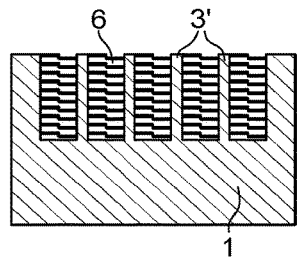
Figure 8:
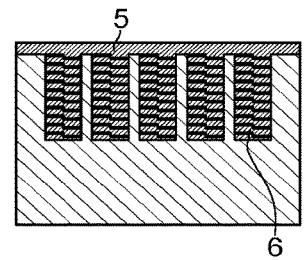

With reference to FIGS. 6 to 8, according to a third embodiment of the method according to the invention, it is provided, according to step a), to produce in a silicon-based substrate 1 pores 2 in order to form, between the pores 2, pillars 3 in the form of fibres 3', as shown in FIG. 6. Between steps a) and b), a step d) is therefore provided of depositing at least one polymer brush 6 on the walls of the silicon-based fibres 3'. Such a polymer brush 6 is described for example in publications WO 2012/152512 and WO 2014/009059. The polymer brushes have fibres of a smaller length than those of the silicon-based fibres so that the polymer fibres are protected by the silicon-based fibres which are more mechanically resistant. Then the silicon-based fibres 3' and the polymer brushes 6 are impregnated with a tribological agent 5, according to step b), the tribological agent 5 being chosen in order to facilitate wetting.

The present invention likewise relates to a micromechanical timepiece part able to be obtained by the method described above. Said micromechanical timepiece part comprises a silicon-based substrate 1 having at least one surface, this surface being able in particular to end up in contact with a surface of another micromechanical timepiece part, said micromechanical timepiece parts being mobile one relative to the other.

According to the invention, at least one part of said surface has pores 2 which open out at the external surface of the micromechanical timepiece part, said pores 2 comprising a tribological agent.

Advantageously, the pores 2 are produced in order to form, between said pores, silicon-based fibres 3'.

According to one embodiment, the silicon-based fibres 3' can comprise walls covered with at least one wetting agent 4 for the tribological agent 5, the silicon-based fibres being impregnated with the tribological agent 5.

According to another embodiment, the silicon-based fibres 3' can comprise walls which are covered by at least one polymer brush 6, the silicon-based fibres 3' and the polymer brush 6 being impregnated with the tribological agent 5.

The method according to the invention makes it possible to manufacture fibres directly in the material of the silicon-based substrate with controlled geometries and properties of mechanical bending which make it possible, in the case of using polymer brushes, to maintain the supra-lubrication behaviour over a wide range of friction conditions whilst increasing reliability. Thus, the method according to the invention makes it possible to compensate for the lack of mechanical resistance of the polymer brushes which are usually used in supra-lubrication. The formed structure of silicon-based fibres constitutes a reservoir of lubricant which is able to restore a sufficient quantity of lubricant into the contact as a function of the stresses.

The geometry of the pores and of the silicon-based fibres can be optimised as a function of the intended friction conditions and tribological objectives. The structuring of the silicon-based substrate can range from silicon-based fibres to open and disordered pores forming a spongy layer.

What is claimed is:

1. A micromechanical timepiece part comprising;
    a silicon-based substrate including at least one surface;
    pores on at least one part of said surface, the pores being configured to open out at an external surface of the micromechanical timepiece part and comprising a tribological agent; and
    pillars between the pores, the pillars being silicon-based fibres, wherein at least one polymer brush including fibres covers walls of the silicon-based fibres, a length of the fibres of the polymer brush being shorter than a length of the silicon-based fibres, the polymer brush and the silicon-based fibres being impregnated with the tribological agent.

2. The micromechanical timepiece part according to claim 1, wherein the pores have an aspect factor (depth:diameter ratio) between 5 and 100.

3. The micromechanical timepiece part according to claim 1, wherein the pores have a depth greater than 100 μm.

4. The micromechanical timepiece part according to claim 3, wherein the pores have a depth greater than 200 μm.

5. The micromechanical timepiece part according to claim 4, wherein the pores have a depth greater than 300 μm.

6. The micromechanical timepiece part according to claim 1, wherein the silicon-based fibres have an aspect factor (depth:diameter ratio) between 5 and 100.

7. The micromechanical timepiece part according to claim 1, wherein the tribological agent is a perfluorocarbonated polymer.

8. The micromechanical timepiece part according to claim 1, wherein the silicon-based substrate is a silicon wafer or an SOI wafer (Silicon-on-Insulator).

9. A method for producing a micromechanical timepiece part including a silicon-based substrate, said method comprising:
    forming pores between pillars on a surface of the silicon-based substrate, the pillars being silicon-based fibres;
    depositing at least one polymer brush including fibres on walls of the silicon-based fibres, a length of the fibres of the polymer brush being shorter than a length of the silicon-based fibres; and
    depositing a tribological agent in said pores.

10. The method according to claim 9, wherein said forming is achieved by a method chosen from a group including a method by electrochemical etching, a method of stain-etching, and a method of MAC-etching.

11. The method according to claim 10, wherein said forming is achieved by the method of MAC-etching.

12. The method according to claim 9, wherein said depositing is achieved by a method of thin-film deposition.

* * * * *